United States Patent [19]

Gordon

[11] Patent Number: 5,656,338
[45] Date of Patent: Aug. 12, 1997

[54] LIQUID SOLUTION OF TIBR$_4$ IN BR$_2$ USED AS A PRECURSOR FOR THE CHEMICAL VAPOR DEPOSITION OF TITANIUM OR TITANIUM NITRIDE

[76] Inventor: Roy G. Gordon, 22 Highland St., Cambridge, Mass. 02158

[21] Appl. No.: 473,499

[22] Filed: Jun. 7, 1995

Related U.S. Application Data

[63] Continuation-in-part of Ser. No. 354,608, Dec. 13, 1994, abandoned.

[51] Int. Cl.$^6$ ................................ B05D 3/06; C23C 16/00
[52] U.S. Cl. ........................ 427/576; 427/573; 427/569; 427/250; 427/255.1; 427/255.2; 427/124; 427/126.1; 427/314
[58] Field of Search ........................ 427/576, 573, 427/569, 250, 255.1, 255.2, 124, 126.1, 126.2, 314

[56] References Cited

U.S. PATENT DOCUMENTS

| | | | |
|---|---|---|---|
| 3,637,422 | 1/1972 | Landingham et al. | 427/229 |
| 4,535,000 | 8/1985 | Gordon | 427/255.2 |
| 4,687,560 | 8/1987 | Tracy et al. | 427/576 |
| 5,139,825 | 8/1992 | Gordon | 427/255.2 |
| 5,266,355 | 11/1993 | Wernberg et al. | 427/248.1 |
| 5,316,579 | 5/1994 | McMillan et al. | 118/50 |
| 5,393,564 | 2/1995 | Westmoreland et al. | 427/248.1 |
| 5,451,260 | 9/1995 | Versteeg et al. | 118/725 |

FOREIGN PATENT DOCUMENTS 3-214734  9/1991  Japan.

*Primary Examiner*—Roy V. King
*Attorney, Agent, or Firm*—Samuels, Gauthier, Stevens & Reppert

[57] ABSTRACT

Chemical vapor deposition of titanium metal is accomplished by forming a liquid solution of titanium tetrabromide in bromine, vaporizing the solution and contacting the vapor mixture with a plasma in the vicinity of a substrate. These titanium films show good conformality, low electrical resistance and are suitable as contact and adhesion layers in semiconductor microelectronics. By mixing ammonia gas with the mixed vapors of titanium tetrabromide and bromine, films containing titanium nitride are deposited at about 400° C. These titanium nitride films are suitable as diffusion barriers and adhesion layers in semiconductor devices.

8 Claims, No Drawings

LIQUID SOLUTION OF TIBR$_4$ IN BR$_2$ USED AS A PRECURSOR FOR THE CHEMICAL VAPOR DEPOSITION OF TITANIUM OR TITANIUM NITRIDE

CROSS-REFERENCE TO RELATED APPLICATION(S)

This application is a continuation-in-part of application Ser. No. 08/354,608 filed on Dec. 13, 1994 now abandoned.

FIELD OF THE INVENTION

This invention relates in general to the chemical vapor deposition (CVD) of titanium and titanium-containing compounds such as titanium nitride, particularly in the form of thin films. Their applications include coatings which are electrically conductive, optically reflective, wear-resistant, and/or corrosion-resistant.

BACKGROUND OF THE INVENTION

Titanium is an example of one of the metals which has found widespread use as an electrically conductive layer in semiconductor microelectronic circuits. Titanium is used in microelectronic devices to provide low-resistance electrical contact to materials, such as silicon or aluminum, that form a stable insulating oxide layer on their surface. Titanium nitride serves as a diffusion barrier to separate silicon from metals in semiconductor devices. Both titanium and titanium nitride serve as bonding agents between materials, such as silicon dioxide and tungsten, which otherwise do not bond strongly together.

This invention relates in particular to a chemical vapor deposition process for depositing titanium and titanium nitride films in a manner that is highly suitable to their application as contact, diffusion barrier and adhesion layers in semiconductor microcircuits.

As microelectronics manufacturers have attempted to make devices that operate faster and are less expensive, they have made narrower openings through which the metallic connections must pass through the insulating layers. The "aspect ratio" is defined as the ratio of the thickness of the insulator layer to the diameter of a hole or the width of a trench through the insulator. In current practice, aspect ratios of 1 or 2 are commonly used. In the next generation of devices, it is widely believed in the industry that aspect ratios of 3 or 4 or more will be used.

Sputtering is usually used to form the titanium and titanium nitride layers in computer processors, memories and other microcircuits. Although sputtering has been successful in coating devices with currently used aspect ratios, it is difficult for sputtering to coat uniformly devices with higher aspect ratios. Sputtering forms coatings which are thicker at the top surface and thinner on the bottoms and lower sidewalls of holes and trenches, and therefore it is said that sputtering has poor "step coverage". While this difficulty of sputtering can be alleviated somewhat by collimating the sputtered material, this leads to other difficulties, including poor sidewall coverage and high cost because of reduced coating rate and greater maintenance requirements.

An alternative coating process with good step coverage would thus be highly useful in semiconductor manufacture. Chemical vapor deposition processes sometimes show very good step coverage, and for this reason CVD processes for titanium and titanium nitride having good step coverage, operating at low enough temperatures, and having relatively non-corrosive byproducts would be advantageous in the manufacture of semiconductor microcircuits.

The requirement for low temperatures is particularly important. In modern semiconductor designs several layers of metal interconnections are applied, and titanium and titanium nitride layers are often used as diffusion barriers and adhesion layers between these successive metal layers. Temperatures during the formation of these upper layers of metallization must be kept below about 400° C. in order to avoid thermal degradation of these structures. Unfortunately, there are no prior art CVD processes for depositing titanium and titanium nitride that meet all of these requirements.

There have been a number of attempts to form titanium by chemical vapor deposition from a number of different reactants. The reaction of titanium tetrahalides with molecular hydrogen is spontaneous only at very high temperatures, which would cause degradation of silicon semiconductor structures. Another difficulty with using this process for semiconductors is that some halogen is deposited as an impurity in the titanium. This residual halogen may cause corrosion of the metal layers. It may also be corrosive to the apparatus used, so that expensive materials of construction must be used.

A lower temperature CVD process for titanium it disclosed in German Patent 1,117,964 (Nov. 23, 1961). This process involves the thermal decomposition of vapors of dicylopentadienyl titanium at temperatures of 260° to 482.2° C. A similar process for depositing titanium, zirconium or hafnium is disclosed in European patent publication 0 468 395 A1 (Jul. 22, 1991) using compounds such as cycloheptatrienyl cyclopentadienyl titanium. Unfortunately, recent attempts to replicate these results have produced high-resistance, porous films containing much more carbon than titanium.

Pure titanium metal has been produced by low-pressure (less than about 0.5 Torr) argon-hydrogen plasma activation of titanium tetrabromide or titanium tetraiodide vapor, as reported by E. T. Eisenbraun, C. Faltermeier, K. Vydianathan, G. Peterson, C. Goldberg, S. Komarov, M. Jones, B. Arkles, A. F. Hepp and E. E. Kaloyeros, paper K5.7 at the fall, 1994 meeting of the Materials Research Society in Boston, Mass. Commercial use of this process is, however, hindered by the difficulty of obtaining reproducible vapor pressures from these solid materials, titanium tetrabromide and titanium tetraiodide. It is also inconvenient to load these hygroscopic solids into bubblers which are conventionally used to supply vapors to such CVD processes.

Titanium nitride has been made by a variety of chemical vapor deposition methods. The earliest CVD process for TiN involves the reaction of titanium tetrachloride vapor with nitrogen and hydrogen at very high temperatures, typically 900° to 1000° C., as reported by W. Schintlmeister, O. Pacher and K. Pfaffinger in the Journal of the Electrochemical Society, volume 123, page 924 in 1976.

The deposition temperature was lowered to temperatures around 400° C. by using preheated ammonia instead of nitrogen and hydrogen, in the process disclosed by Gordon, U.S. Pat. No. 4,535,000 in 1985. Titanium tetrabromide and titanium tetraiodide are slightly more reactive than titanium tetrachloride, particularly at temperatures around 400° C. However, titanium tetrachloride was preferred in this Gordon patent over titanium tetrabromide or titanium tetraiodide, because the latter two compounds are solids which are less convenient to vaporize than is the liquid titanium tetrachloride. Titanium nitride was also deposited by the reaction of titanium tetrabromide and ammonia at substrate temperatures of 500° to 750° C. by Toshiaki Hasegawa et al., Japanese Patent Appln. No. 02-10092 filed Jan. 19, 1990.

Chemical vapor deposition of titanium nitride at temperatures below 400° C. was first achieved by Gordon, Fix and Hoffman and disclosed in U.S. Pat. No. 5,139,825 in 1992. However, the step coverage shown by this process may not be as complete as is desired by the semiconductor industry.

SUMMARY OF THE INVENTION

It is one object of the invention to provide a process for the plasma-induced chemical vapor deposition of titanium metal with excellent step coverage at low temperatures.

Another object of the invention is to provide a process for the chemical vapor deposition of titanium nitride with excellent step coverage, at low temperatures.

A particular object of the invention is to deposit titanium metal or titanium nitride uniformly over semiconductor devices having holes and/or trenches with high aspect ratios.

A further object is to deposit uniform, electrically conductive titanium metal or titanium nitride films at a low enough temperature so that microelectronic devices with one or more metallized layers are not harmed by heating during the process.

Another object is to provide a process for depositing a low-resistance electrical contact to layers of a microelectronic device.

Another object is to provide a liquid solution of titanium tetrabromide dissolved in liquid bromine which solution is especially formulated for the chemical vapor deposition of titanium metal or titanium nitride.

Another object is to provide a means for promoting adhesion between layers of a multilayer device.

A particular object of the invention is to deposit a layer of titanium nitride which functions as an electrically conductive diffusion barrier between metals and silicon in semiconductor devices.

Other objects of the invention will be obvious to those skilled in the art on reading the instant invention.

In one preferred embodiment of the invention, a liquid mixture of titanium (IV) bromide (commonly known as titanium tetrabromide) and bromine is vaporized, and this vapor mixture is brought into contact with a plasma near the surface of a heated substrate on which a titanium or titanium-containing layer then deposits. Optionally, the flow of the vapor mixture may be diluted with an inert carrier gas, such as helium, neon or argon. The process is preferably carried out at a reduced pressure. Air, water vapor and other oxygen-containing compounds are excluded from the vapor mixture.

In another preferred embodiment of the invention, a liquid mixture of titanium tetrabromide and bromine is vaporized, and this vapor mixture is brought into contact with ammonia gas near the surface of a heated substrate on which titanium nitride or a titanium-nitride-containing layer then deposits. Plasma activation is not necessary for inducing deposition of pure titanium nitride by the reaction of titanium tetrabromide with ammonia at sufficiently high substrate temperatures, but plasma activation may be used to induce reaction at lower substrate temperatures.

Plasma-induced chemical vapor deposition apparatus suitable for carrying out the invention is known in the art.

DESCRIPTION OF THE PREFERRED EMBODIMENT(S)

The preferred titanium source for the practice of this invention is a liquid solution of titanium tetrabromide dissolved in liquid bromine. A saturated solution at room temperature was found to contain about 88 percent by weight of titanium tetrabromide and 12 percent by weight of bromine. Any solution containing 88 percent or less by weight of titanium tetrabromide is liquid at room temperature. Thus, it is convenient to pump such a liquid solution with a metering pump held at room temperature, from a liquid storage vessel through plumbing lines held at room temperature, into a heated region in which the solution is vaporized.

Within the scope of the invention, a composition of titanium tetrabromide dissolved in liquid bromine especially suitable for purposes of the invention is between about 60 to 88% by weight of titanium tetrabromide in bromine. The composition of the invention within this range results in ease of handling of the solution in conventional CVD processing equipment while ensuring compatibility with the stoichiometric requirements of the other parameters of the CVD process.

The vaporization region should be held at a temperature high enough to vaporize the solution completely. The minimum temperature required to vaporize the solution depends upon the pressure at which the CVD reactor is operated. For a CVD process carried out below 500 milliTorr, 100° C. is a suitable vaporization temperature. For processes carried out at higher pressures, a higher vaporization temperature may be preferred. In any case, the temperature of the vaporizer region should be kept above the melting temperature of pure titanium tetrabromide, about 39° C., in order to avoid the formation of any solid titanium tetrabromide as the more volatile bromine tends to evaporate faster than the titanium tetrabromide, forming a more concentrated solution within the vaporizer.

The vaporization region may also contain a means to increase the surface area of the solution to be evaporated, thereby increasing its rate of evaporation. For example, the vaporization region may contain a stack of disc-shaped plates between which the solution is pumped to spread out on the outer cylindrical surface of the plates. In another method, ultrasonic vibrations may be used to break up the solution into a spray of droplets with a large surface area.

Another novel use for this liquid solution of titanium tetrabromide in bromine, is to use it to refill conventional bubbler sources with titanium tetrabromide. Because titanium tetrabromide is a highly hygroscopic solid, it must be handled in a controlled dry atmosphere, such as a glove box. In addition, it is generally inconvenient to load solids into a bubbler, and such filling processes are difficult to automate. Liquids are much easier to use in refilling bubblers from a storage container, and automated systems for transferring liquids are commonly used. After refilling a bubbler with a liquid solution of titanium tetrabromide in bromine, the bromine may be removed from the bubbler by distillation, leaving the bubbler filled with titanium tetrabromide.

The storage vessel, pump, vaporizer, plumbing, CVD chamber and all surfaces which are exposed to the solution or vapor should be constructed of materials which resist corrosion. Suitable materials include nickel alloys such as Inconel™ and Hastelloy™, glass, fused quartz, ceramics such as alumina, plastics such as polyethylene, and fluorinated plastics such as polytetrafluoroethylene and polyfluoroethylene-propylene.

The preferred temperature range for carrying out the chemical vapor deposition process varies somewhat, depending on the specific conditions, such as pressure and plasma power. The preferred titanium tetrabromide-bromine vapor mixture generally reacts at a substrate temperature below 500° C., more preferably below 450° C., and most preferably around 400° C. Silicon substrates bearing one or more already-deposited aluminum layers should be kept below about 425° C.

When a titanium deposit is desired, a preferred carrier gas is an inert gas such as argon, and an argon-hydrogen plasma is used to induce the deposition.

When a titanium nitride deposit is desired, then ammonia gas is mixed with the titanium tetrabromide and bromine vapors, and either nitrogen or argon is a preferred carrier gas. Substrate temperatures of about 500° to 700° C. are typically used with these reactants to deposit relatively pure titanium nitride, in the absence of any plasma activation. Lower substrate temperatures, such as 400° C. can be used along with plasma activation.

The preferred pressure range for operating the process will depend on the particular apparatus. Apparatus designed to operate at low pressure, generally less than one Torr, may employ a gas distribution manifold ("showerhead") similar in size to the wafer being coated. The following experiments can be carried out in a low-pressure plasma-enhanced chemical vapor deposition apparatus, such as the one described in the paper by Eisenbraun et al., cited above, and references given in that paper.

EXAMPLE 1

A solution is prepared by mixing 85 weight percent titanium bromide and 15 weight percent bromine. This solution remains completely liquid at temperatures above about 15° C. The solution is placed within the reservoir of a MKS Instruments Type LDS-100 direct liquid injection system. This system contains a micrometering pump which transfers the solution from the reservoir at a low and precisely controlled rate into a vaporizer unit which converts the solution into a vapor mixture in an argon carrier gas flowing at a rate of 60 sccm. The system is constructed of Inconel™, a nickel alloy which resists corrosion by this solution. The bromine solution of titanium tetrabromide is pumped by an MKS metering pump into an MKS vaporizer held at 100° C. The vapor mixture thus produced then passes directly into the gas distributor ("showerhead") of a CVD reaction chamber through transfer lines heated to about 120° C. An additional flow of 600 sccm of a 90% argon, 10% hydrogen gas mixture is introduced through separate holes in the showerhead. A plasma power of 0.15 W/cm$^2$ is maintained for a period of two minutes, during which time the substrate is maintained at a temperature of about 400° C. Then the substrate is cooled in a flow of pure argon.

Analysis of the deposited film by Rutherford Backscattering Spectroscopy shows that it consists predominantly of titanium metal. The film shows good conformal coverage of holes and trenches. It makes low-resistance contact to doped silicon, to metal silicides, such as titanium silicide, cobalt silicide and platinum silicide, and to metals including tungsten, aluminum, copper, silver and gold.

EXAMPLE 2

Example 1 is repeated with the replacement of the argon-hydrogen gas mixture by a 90% ammonia-10% hydrogen gas mixture added through the separate set of inlet holes in the showerhead. The deposited film is composed mainly of titanium nitride. CVD, W, Al and Cu nucleate well on the TiN, and adhere well to it.

EXAMPLE 3

Example 2 is repeated with the plasma power turned off, and the substrate heated to about 550° C. The deposited film is composed mainly of titanium nitride.

EXAMPLE 4

Example 1 is repeated, except that after two minutes of deposition ammonia gas is separately injected in stoichiometric excess into the chamber, for an additional two minutes. The deposited film is a bilayer composed of titanium on the substrate, covered by titanium nitride. The bilayer provides a low resistance contact to silicon and also serves as a good diffusion barrier.

EXAMPLE 5

A liquid solution of 80 weight percent titanium tetrabromide and 20 weight percent bromine is prepared. It is found to remain completely in the liquid state down to a temperature of 8° C. A portion of this liquid solution is pumped from its storage container into a bubbler. The bubbler is then connected to a cold vapor trap, and heated until bromine no longer distills out of the bubbler. The bubbler is then used as a source for titanium tetrabromide vapor in chemical vapor deposition processes similar to those described in examples 1 to 4, by heating the bubbler and optionally passing a carrier gas through it. This method of reloading a bubbler avoids the inconvenience of filling a bubbler with the highly hygroscopic solid titanium tetrabromide.

The foregoing description has been limited to specific embodiments of the invention. It will be apparent, however, that variations and modifications can be made to the invention, with the attainment of some or all of the advantages of the invention. Therefore, it is the object of the appended claims to cover all such variations and modifications as come within the true spirit and scope of the invention.

Having described my invention, what I now claim is:

1. A process for the chemical vapor deposition of titanium or a titanium-containing material on a substrate comprising the steps of:
   a) forming a liquid solution of titanium tetrabromide dissolved in bromine;
   b) vaporizing said solution to form a vapor mixture;
   c) contacting said vapor mixture with a plasma in the vicinity of the substrate; and
   d) depositing the titanium or the titanium-containing material on said substrate.

2. A process for the chemical vapor deposition of titanium nitride or a titanium nitride-containing material comprising the steps of:
   a) forming a liquid solution of titanium tetrabromide dissolved in bromine;
   b) vaporizing said solution to form a vapor mixture;
   c) mixing said vapor mixture with ammonia vapor in the vicinity of a heated substrate; and
   d) depositing the titanium nitride or the titanium-nitride-containing material on said substrate.

3. The process of claims 1 or 2 in which said solution is liquid at room temperature.

4. The process of claims 1 or 2 in which the titanium tetrabromide content of the solution is not more than 88 weight percent.

5. The process of claims 1 or 2 in which the titanium tetrabromide content of the solution is not more than 85 weight percent.

6. The process of claims 1 or 2 in which the titanium tetrabromide content of the solution is not more than 80 weight percent.

7. A process for the chemical vapor deposition of titanium metal or a titanium-containing material, said process comprising the steps of:

a) forming a liquid solution of titanium tetrabromide dissolved in bromine;

b) transferring some or all of said liquid solution into a container;

c) removing all or most of the bromine out of said container by distillation;

d) flowing titanium tetrabromide vapor out of said container into a chamber for chemical vapor deposition;

e) contacting said titanium tetrabromide vapor with a plasma; and f) depositing the titanium metal or the titanium-containing material on a substrate in said chamber.

8. A process for the chemical vapor deposition of titanium nitride or a titanium nitride-containing material, said process comprising the steps of;

a) forming a liquid solution of titanium tetrabromide dissolved in bromine;

b) transferring some or all of said liquid solution into a container;

c) removing all or most of the bromine out of said container by distillation;

d) flowing titanium tetrabromide vapor out of said container into a chamber for chemical vapor deposition;

e) mixing said titanium tetrabromide vapor with ammonia vapor in the vicinity of a heated substrate in said chamber; and f) depositing the titanium nitride or the titanium-nitride-containing material on a substrate in said chamber.

* * * * *